United States Patent [19]

Bernin et al.

[11] 4,099,176
[45] Jul. 4, 1978

[54] MAGNETIC KEY SWITCH HAVING A REMOVABLE SUPPORT ASSEMBLY

[75] Inventors: Victor M. Bernin, Mt. Prospect; Carl G. Knoll, Melrose Park; Robert C. Madland, Mt. Prospect, all of Ill.

[73] Assignee: Illinois Tool Works Inc., Chicago, Ill.

[21] Appl. No.: 525,416

[22] Filed: Nov. 20, 1974

Related U.S. Application Data

[63] Continuation of Ser. No. 474,571, May 30, 1974, abandoned, which is a continuation of Ser. No. 388,510, Aug. 15, 1973, abandoned.

[51] Int. Cl.² ............... H03K 17/02; H01C 7/16
[52] U.S. Cl. .................... 340/365 L; 340/365 R
[58] Field of Search .............. 340/365 R, 365 L; 200/295, 296

[56] References Cited

U.S. PATENT DOCUMENTS

| | | | |
|---|---|---|---|
| 3,142,742 | 7/1964 | Kaleba et al. | 200/159 |
| 3,558,875 | 6/1971 | Gabor | 340/347 |
| 3,676,630 | 7/1972 | Dennison | 200/168 K |
| 3,714,611 | 1/1973 | Madland | 335/229 |
| 3,719,902 | 3/1973 | Esterly | 340/365 L |
| 3,765,014 | 10/1973 | Taylor | 340/365 L |

*Primary Examiner*—Marshall M. Curtis
*Attorney, Agent, or Firm*—Glenn W. Bowen; Robert W. Beart

[57] ABSTRACT

A keyboard switch employing a saturable magnetic core and a pair of permanent magnets attached to a key stem is disclosed. When the key is not depressed the saturable magnetic core is saturated by the adjacent magnets, and when the key is depressed the core becomes unsaturated. The magnetic core and the associated drive and sense wires are secured in a plastic support assembly. The plastic housing of the switch and the support assembly are constructed so that the support assembly may be secured in place in the plastic housing and may also be removed from the housing when connection to a printed circuit board is to be made.

2 Claims, 13 Drawing Figures

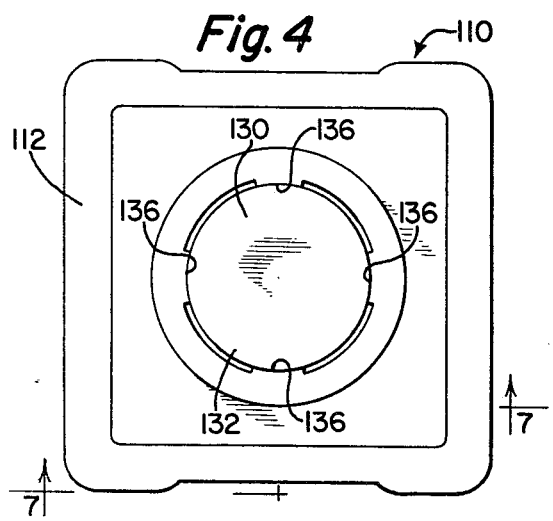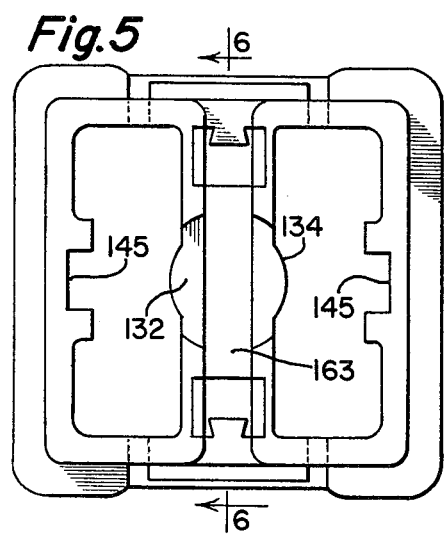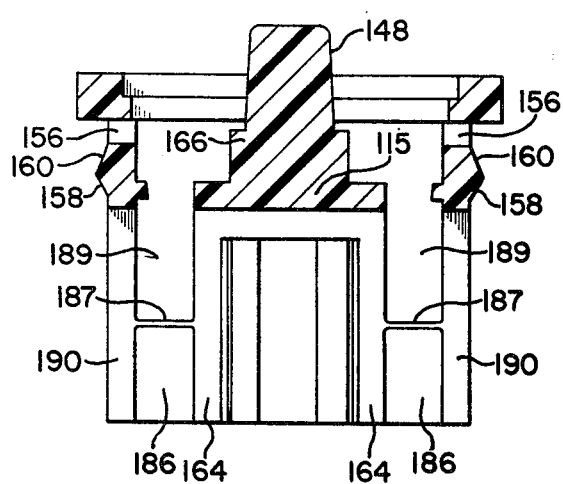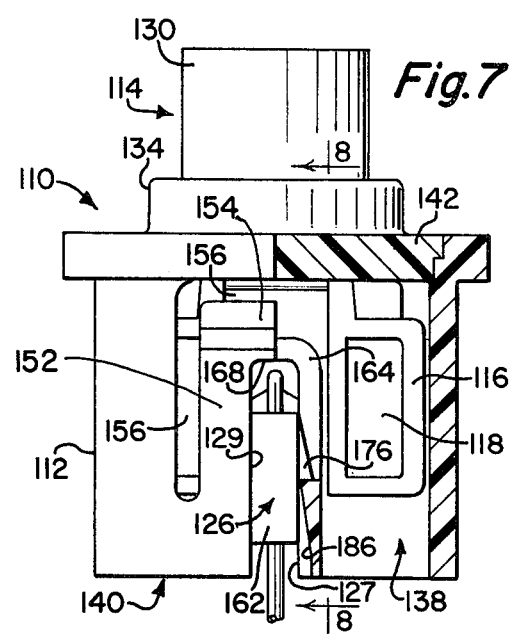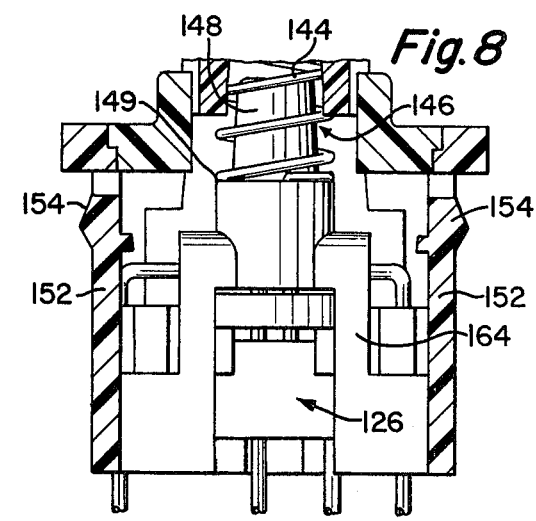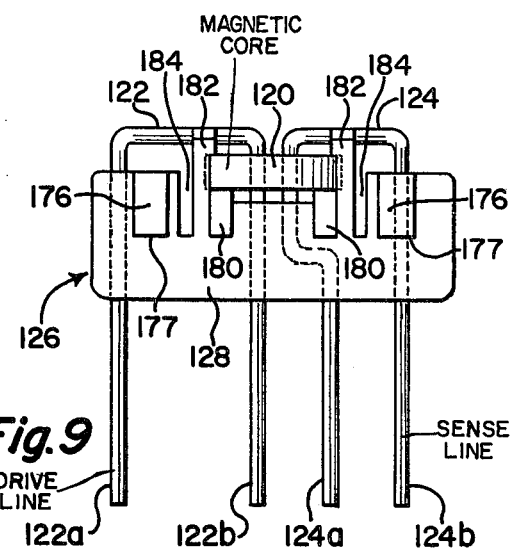

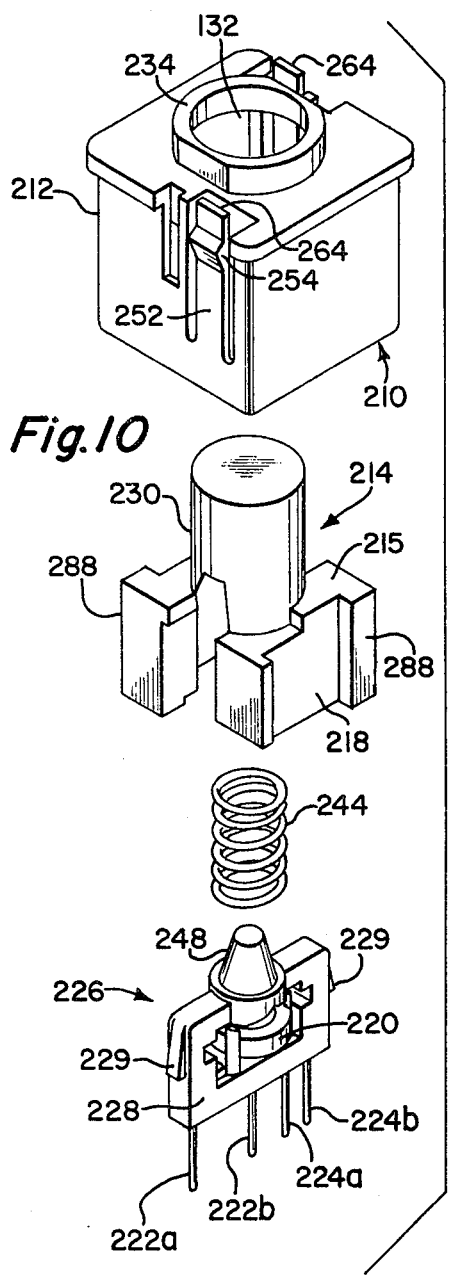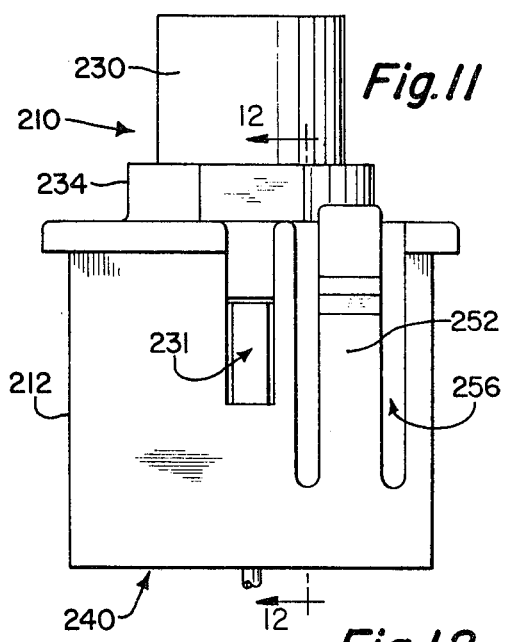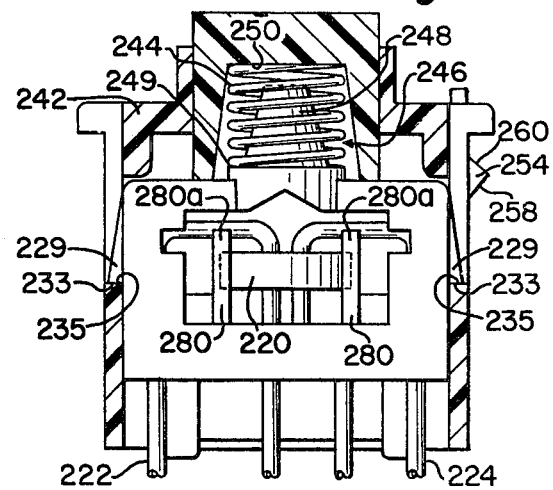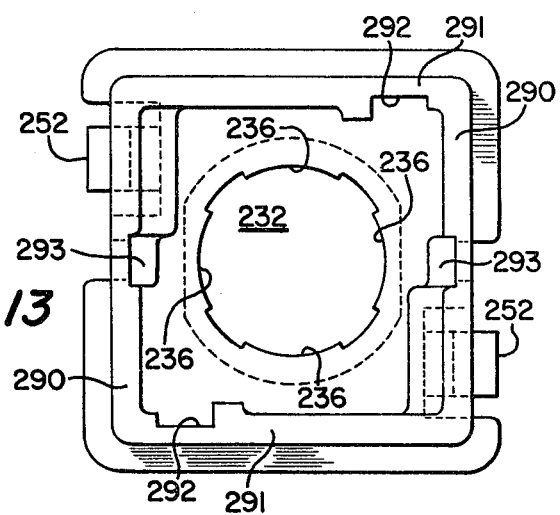

MAGNETIC KEY SWITCH HAVING A REMOVABLE SUPPORT ASSEMBLY

This is a continuation of application Ser. No. 474,571, filed May 30, 1974, now abandoned, which is a continuation of application Ser. No. 388,510, filed Aug. 15, 1973, now abandoned.

BACKGROUND OF THE INVENTION

In U.S. Pat. No. 3,638,221, which is assigned to the assignee of the present invention, a magnetic key switch is disclosed in which a saturable magnetic core is permanently mounted in the housing of a switch. A pair of permanent magnets are attached to the depressible key stem of the switch so that when the key stem is not depressed the saturable core is saturated, and, thus, an output signal will not be produced on a sense line which is coupled to the core adjacent to a drive line which is also coupled to the core and to a source of electrical pulses. When the key stem is depressed the core is unsaturated, since the magnets are then displaced from it, and an output signal is produced on the sense lines due to inductive coupling between the sense line and the drive line. While the switch of the above-noted patent has proved to be highly advantageous from a functional standpoint it is been found to be desirable in certain applications to be able to separate the despressible key stem section from the magnetic core, sense and drive line section of the key switch so that replacement of a mechanical component of the switch, such as the plunger return spring, can be made, when necessary, without complete disassembly of the switch and without unsoldering the drive and sense wires from a printed circuit board or other type of connector. In U.S. Pat. application Ser. No. 259,209, which is also assigned to the assignee of the present invention, several versions of a support assembly suitable for supporting the magnetic core and the associated sense and drive windings of a magnetic key switch are disclosed. However, the support assemblies of the above-noted patent application were not constructed so as to be selectively retainable and selectively removable from the housing of the key switch.

In order to facilitate repair and reduce repair cost the drive and sense lines and the magnetic core of the switch of the present invention are supported by a support assembly which may be selectively retained in the housing of the switch during handling and storage, and which may be easily removed from the housing if repair or connection to a printed circuit board is desired. In the highly competitive switch business the desirable feature of a selectively removable unitary support assembly for the magnetic core and the associated sense and drive line wires of a magnetic key switch must be provided at a relatively low cost, and this is also achieved by the present invention.

DESCRIPTION OF THE DRAWINGS

FIG. 4 is a top view of a first version of a key switch in accordance with the present invention.

FIG. 5 is a bottom view of the key switch of FIGS. 7 - 9.

FIG. 6 is a cross-sectional view of the key switch of FIGS. 4 - 9 taken along the lines 6 — 6 in FIG. 7, with the top plate of the switch removed.

FIG. 7 is a cross-sectional view of the key switch of FIGS. 4 - 9 taken along the lines 7 — 7 of FIG. 1.

FIG. 8 is a cross-sectional view of the key switch of FIGS. 4 - 9 taken along the lines 8 — 8 of FIG. 7.

FIG. 9 is a side view of the support assembly of the key switch of FIGS. 4 - 9.

FIG. 10 shows an exploded perspective view of a second version of a key switch in accordance with the present invention.

FIG. 11 is a side view of the key switch of FIGS. 10 - 13.

FIG. 12 is a cross-sectional view of the key switch of FIGS. 10 - 13 taken along the lines 12 — 12 of FIG. 11.

FIG. 13 is a top view of the key switch of FIGS. 10 - 13.

TECHNICAL DESCRIPTION OF THE INVENTION

Figure 1:
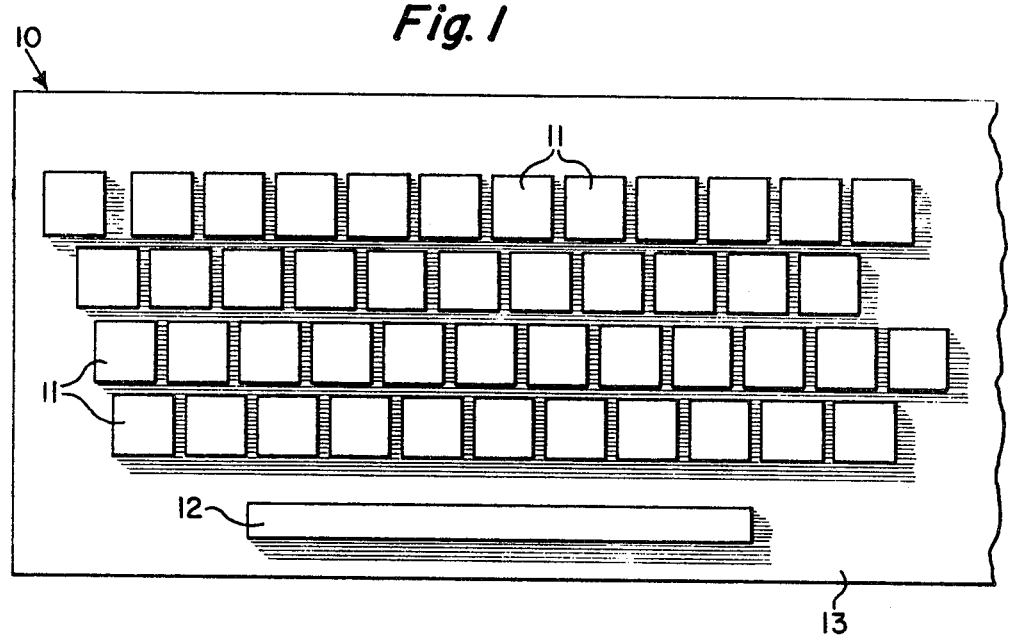
FIG. 1 shows a top view of a keyboard constructed using key switches of the present invention.

The operation of magnetic switches in accordance with this invention may be described by reference to FIGS. 1, 2 and 3. Referring now to FIG. 1 there is seen a top view of a keyboard unit constructed in accordance with the principles of this invention and is designated generally by reference numeral 10. The keyboard 10 is illustrated here as a conventional typewriter keyboard having a plurality of key buttons 11 with indicia on the top surface thereof corresponding to the letter of the typewriter which will be reproduced or printed when the key is depressed. Also provided on the keyboard 10 is a space bar 12, and other conventional switch actuated devices such as those used for capital letters and special tab or margin spacings. The key buttons 11 and the space bar 12 extend upwardly from a support cover or housing 13 through which the top of the keyboard switches extend. The housing 13 firmly holds the switch bodies in place. It will be understood that any suitable keyboard configuration can be incorporated in accordance with the principles of this invention, as for example, the keyboard may be arranged in rows and columns of numbers for use with an adding machine or the like, and the keyboard may be provided with an elongated slot for receiving such things as bank passbooks or the like for printing indicia thereon from a computer storage network.

Figure 2:
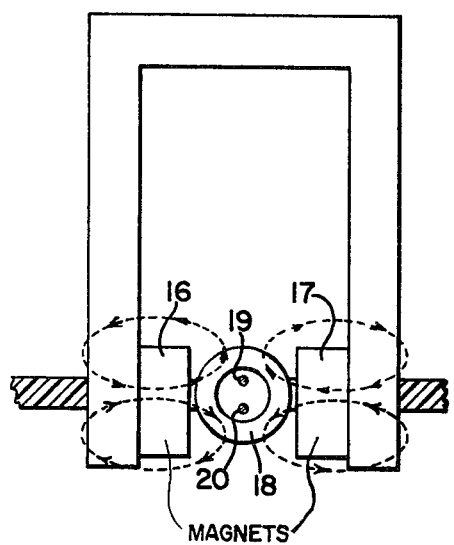
FIG. 2 is a diagramatic showing of a key switch in accordance with the present invention with the key button undepressed.
Figure 3:
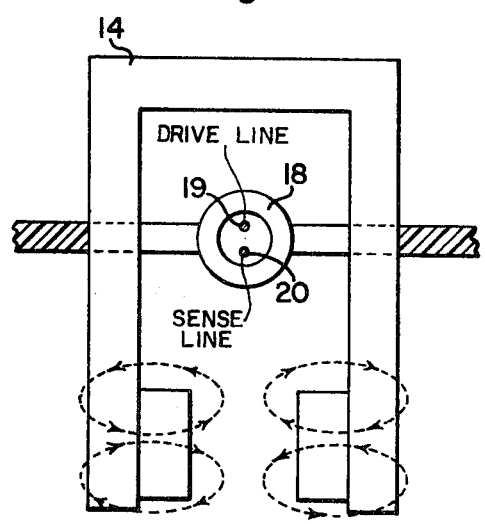
FIG. 3 is a diagramatic showing of a key switch in accordance with the present invention with the key button depressed.

The operational theory of solid state switches incorporated in the keyboard construction of this invention is shown in FIGS. 2 and 3. Here a U-shaped magnet support member 14 has secured to the lower leg portions thereof a pair of magnets 16 and 17 diametrically opposed and on opposite sides of a magnetic toroidal core 18. Passing through the magnetic toroidal core 18 are a pair of wires 19 and 20, one of which is a drive line wire and the other of which is a sense line wire. When the magnets are positioned, as shown in FIG. 2, the magnetic toroidal core 18 is in a magnetically saturated condition. Therefore, pulse signal information, which may be considered an AC signal, passing along the drive wire will not be transformer coupled to the sense wire. However, when the U-shaped magnet support member 14 is depressed as shown in FIG. 3, this being accomplished by pushing on one of the buttons 11 of FIG. 1, the magnets 16 and 17 are moved away from close proximity to the magnetic toroidal core and allow pulse signal information along the drive wire to be transformer coupled to the sense wire where it will be delivered to a readout circuit, in a well-known manner.

One version of the present invention is shown in the FIGS. 4 through 9 and is referred to generally by the reference numeral 10 in FIG. 1. In this switch a housing 112 receives a plunger and magnet support member 114. The support member 114 has a pair of legs 116, each of which support a magnet 118 on opposite sides of a magnetic toroidal core 120. Passing through the magnetic toroidal core 120 are a pair of wires 122 and 124, one of which is a drive line wire and the other of which is a sense line wire. When the magnets are positioned, as shown in FIG. 2, the plunger is undepressed and the magnetic toroidal core 120 is in a magnetically saturated condition and pulse signals passed along the drive wire are not transformer coupled to the sense wire. However, when the plunger 114 is depressed, as shown in FIG. 3, by pushing down on one of the keys 11 of FIG. 1, the magnets 118 are moved away from close proximity to their associated magnetic toroidal core 120, and pulse signals on the drive wire are inductively coupled to the sense wire which can be coupled to conventional readout circuits.

The switch 110 of FIGS. 4 through 9 consists basically of four main parts which are assembled together. These are: a plastic housing 112, a plunger and magnet assembly 114, a support assembly 126 comprising the magnetic core 120, a plastic support element 128 and at least one drive line wire and one sense line wire (122, 124) which thread the core 120 and are molded into the support element 128 and a return spring 144 for the plunger and magnet assembly 114.

The construction of the plunger and magnet assembly 114 is best shown by reference to FIGS. 7 and 8. The plunger 115, which holds the magnets 118, is preferably formed of plastic and is relatively rigid. The plunger and magnet assembly 114 consists of an upwardly projecting plunger or key post 130 which extends through the aperture 132 in the boss 134 into the interior of the housing 112. The key post 130 is centered in the aperture and rides on a number of bearing surfaces 136. The top of the housing 112 is closed by the top plate 142, on which the boss 134 is formed. The plate 142 is secured into place by adhesive, ultrasonic welding or other suitable means.

The switch of the present invention is operated when the key post 130 is depressed. The legs 116 of the plastic plunger 115 are disposed in clearance openings 138 which guide the legs 116 and the magnets 118 as they move toward the open bottom 140 of the housing 112. The plunger and magnet assembly 114 is returned to its upward position following each depression of the key post 130 by the coiled spring 144. The upper end of the spring 144 is received in a cylindrical passageway 146 in the key post 130 and abuts the upper surface (not shown) of the passageway 146. The lower end of the spring 144 encircles spring seat post 148 that is integrally formed on an interior portion of the housing 112, and the spring 144 is seated on the surface 149 of the post 148. The legs 116 are formed with projections that fit into the guide channels 145 that are formed in the interior walls of the housing 112 in the openings 138 in order to guide the plunger and magnet assembly 114 in its upward and downward motion during operation of the switch 110.

In order to secure the switch 110 in place in a keyboard aperture in a keyboard support plate (not shown) resilient arms 152 are provided which extend from the sides of the housing 112. The resilient arms 152 are provided with locking tabs 154 and are separated from the housing 112 by slots 156. Thus, when the housing 112 is pressed downwardly the action of the surface of the keyboard plate on the lower angled surfaces 158 of the locking tabs 154 causes the arms 152 to flex inwardly as the switch 110 is pressed into place. Once the housing 112 is in place the arms 152 unflex and thereby retain the switch 110 in the keyboard support plate. The switch 110 may be removed from the support plate only if sufficient force is applied to the upper angled surfaces 160 to again flex the arms 152 inwardly by an amount sufficient to allow removal of the switch 110 from the keyboard support plate.

The saturable magnetic core 120 and the sense and drive line wires 122, 124 of the switch 110 are retained in the support assembly 126 which is removably insertable into the housing 112. By making the support assembly 126 removable from the housing 112 it is possible to secure the substantially coplanar terminal ends 122a, 122b, 124a and 124b of the substantially U-shaped drive and sense line wires 122, 124 into a printed circuit board with the support assembly 126 removed from the housing 112. The drive and sense line wires 122, 124 are preferably molded into the plastic support element 128.

In order to receive the removable support assembly 126 the housing 112 has a slot 162 which opens to the bottom 140 of the housing 112. The slot 162 has a relatively narrow width in comparison with the width of the openings 138 and it is substantially centrally located between the magnets 118. Two C-shaped bracket arms 164 which are integrally formed with the housing 112 are joined at their upper ends to define the slot 162. The spring seat post 148 extends upwardly from the integrally formed boss 166 above the bracket arms 164. The upper portion of the slot 162 terminates at the wall 168, but a groove extension 163 of the slot 162 is preferably formed in the wall 168 to receive the upper ends of the drive and sense line wires 122, 124. Just below the groove 163 in the wall 168 there are two landings 172, 174 which are shaped to correspond generally to the outer periphery of the core 120, and the upper surface of the core 120 is abutted against the landings 172, 174 when the support assembly 126 is fully inserted into the housing 112.

The support assembly 126 is retained in place in the housing 112 between the bracket arms 164 my means of a snap-in lock construction. To achieve this locking action the assembly 126 is formed with a pair of generally triangular shaped wedges 176 which extend downwardly from the upper portion of the support assembly 126, with the ramp portion of the wedges increasing as it approaches the bottom of the assembly 126, as best shown in the FIG. 7. The support assembly 126 is locked into position by the action of the wedges 176, which fit into the corresponding ramps 186 that are formed in the housing 112 between the two bracket arms 164 and the outer walls 190. The ramps 186 are shaped so that they slope inwardly as they approach the upper portion of the housing 112, as best shown in FIG. 7. When the support assembly 126 is forced into the slot 162 from the bottom 140 of the housing 212 the wedges 176 ride in the ramps 186 until the support assembly 126 is located in position with the switch core 120 being located substantially adjacent to the upper wall 168 of the slot 162. The lower edges 177 of the wedges 176 will then project into the apertures 189 and engage the surfaces 187 of the housing 112 just above the ramps 186, thereby locking the assembly 126 in place in the housing 112. The bracket arms 164 pass through the wedges 176 and the braces 182, as shown best in FIG. 8, so as to receive the support assembly 126 and to guide the wedges 176 toward and away from the apertures 189. By wedging apart housing walls 127, 129 which define the slot 162, and at the same time pulling downwardly on the support assembly 126 with sufficient force, the locking engagement of the edges 177 with the surfaces 187 will be released so that the support assembly 126 is easily removed from the housing 112. Manual insertion and removal of the support assembly 126 is, therefore, possible with the switch 110. Wedging apart of the walls 127, 129 is not necessary when the support assembly 126 is inserted into the switch 110.

In addition, the support assembly 126 has a pair of braces 182 which are integrally formed from the support element 128 and are positioned on diametrically opposite sides of the magnetic core 120. The braces 182 preferably have an arcuate shape. The braces 182 are spaced from the remainder of the support element 126 by the inner slots 180 and the outer slots 184. If the core 120 were held solidly in the support assembly 126 shrinkage following molding could put pressure on the core 120 which might cause an undesirable change in its magnetic properties to the point that an unacceptable switch could result. The movable braces 182 are free to give so as to relieve the pressure on the core 120 which would otherwise result from molding of the plastic support element 128, thereby allowing the core 120 to remain in a pressure free state so it can operate normally.

Another version of the present invention is shown in FIGS. 10 through 13. The switch of this version, which is designated generally by the reference numeral 210 in FIG. 7 and it has the same basic components as the switch 110 of FIGS. 4 through 9. These are the plastic housing 212, the plunger and magnet assembly 214, a return spring 244 and the support assembly 226 comprising the magnetic core 220, a plastic support element 228, and at least one drive line wire and one sense line wire (222, 224) which thread the core 220 and are molded into the support element 228.

While the housing 112 of the switch 110 of FIGS. 4 through 9 is relatively rigid because of its configuration, the housing 212 of the switch 210 of FIGS. 10 through 13 is constructed to have sides that are relatively resilient when they are pressed so that two opposing walls of the housing 212 will bulge when pressure is applied to the other two opposing walls of the housing. This resiliency is achieved in part by the substantially open interior of the housing 212. The purpose of making the housing resilient is to simplify the construction of the housing 212 while still providing for easy removability of the support assembly 226 from the housing 212 of the switch.

The plastic support element 228 supports the magnetic core 220 and the molded-in, generally U-shaped drive sense conduction 222, 224 which have their longitudinal axis supported in the support assembly 226 in substantially the same plane. The substantially coplanar terminal ends 222a, 222b, 224a, and 224b extend below the support assembly 226 so that they may be easily insertable into apertures in a printed circuit board. The support element 228 of the support assembly 226 also has a pair of integrally formed, outwardly projecting wedges 229 on its upper portion. The wedges 229 project into apertures 231 to lock the support assembly 226 into place in the housing 212. A spring seat post 248 is integrally formed on the top of the molded plastic support member 228 so as to overlie the magnetic core 220. A return spring 244 for the plunger and magnet assembly 214 fits over the post 248. The bottom of the spring 244 is seated on the surface 249 and the top of the spring 244 is inserted into a cylindrical passageway 246 in the interior of the depressible key post 230 and the upper end of the spring 244 abuts the upper surface 250 of the passageway 246. The magnetic core 220 is supported on the support element 228 by integrally formed braces 280 which extend upwardly and outwardly from both sides of the support element 228 so as to help support the magnetic core 220 between them. The braces 280 on diametrically opposite sides of the magnetic core 220 preferably have an arcuate shape and are constructed like the braces 182 so as to be freely movable in order to relieve molding pressures on the core 220.

The housing 212 is closed at the top by a top plate 242 which is integral with the housing and which has a boss 234 that extends upwardly therefrom. The boss 234 has an aperture 232 in it to receive the depressible key post 230 of the plunger and magnet assembly 214. The key post 230 is centered in the aperture 232 and rides on a number of bearing sufaces 236.

The housing 212 is also provided with a pair of resilient arms 252, which have locking tabs 254. The locking tabs 254 have lower angled surfaces 258 which cause the arms 252 to be flexed inwardly when the switch 210 is pressed down into the aperture in the keyboard support plate since they are separated from the remainder of the housing 212 by the slots 256. Once the switch 210 is in place the arms 252 will unflex and the upper angled surfaces 260 of the locking tabs 254 will engage the keyboard support plate to lock the switch 210 in position. The switch 210, however, can be removed from the keyboard support plate if sufficient pressure is applied across the release tabs 264 to again flex the arms 252 inwardly by an amount sufficient to allow removal of the switch 210 from the keyboard support plate.

The plastic plunger 215 of the switch 210 holds a pair of permanent magnets 218 on its lower portion. Corresponding guide channels 292 for receiving guide members 288 of the plunger 215 are formed in the inner surfaces of the walls 291 of the housing 212.

As previously mentioned, the housing 212 contains a pair of rectangular apertures 231 on opposite sides of the housing structure 212 which are located in alignment with the grooves 293 in the walls 290. The grooves 293 are provided to receive the support element 228 when it is inserted into the housing 212 through the open bottom 240 and to guide the wedges 229 toward and away from the apertures 231. The apertures 231 are provided to receive the wedge sections 229 of the support assembly 226 in order to lock the support assembly 226 into the housing 212. The plunger and magnet assembly 214 is inserted into the housing 212 through the open bottom 240 so that the key post 230 is placed into the aperture 232. The spring 244 will then be positioned in place in the cylindrical passageway 246 with its upper end in engagement with the surface 250. The support assembly 226 is locked into position when the wedges 229 are in the apertures 231. Because of the downward slope of the wedges 229 the support assembly 226 can readily be insertable into the housing 212 by means of upward pressure on it. When the support assembly 226 is in place the lower surfaces 233 of the wedges 226 will engage the adjacent surfaces 235 of the wall 290 at the bottom of the associated aperture 231 and thereby lock the support assembly 226 in place in the housing 212.

While the downward slope of the wedges 229 make it easy to insert the support assembly 226 into the housing 212 they tend to prevent removal of the support assembly merely by application of a downward force to it. The support assembly 226 is, however, easily removable from the housing 212 by causing the side walls 290 to flex outwardly by means of inward pressure applied across the opposite walls 291. Proper application of sufficient pressure to the walls 291 will flex the walls 290 outwardly sufficiently so that the inner edges of the surfaces 233 of the wedges 229 are disposed inwardly from the outer edges of the surfaces 235 of the housing so that the support assembly 226 may be moved from the housing 212 by application of a simultaneous downward force to it. Manual removal and insertion of the support assembly 226 is thus possible with the switch 210.

While various versions of the present invention have been described other versions of the present invention that are within the scope of the appended claims will be obvious to those skilled in the art, and, hence, are intended to be comprehended by the claims of this invention.

What is claimed is:

1. A keyboard switch comprising a housing, an actuating member and at least one permanent magnet coupled to said actuating member so as to change from a first position to a second position when said actuating member is actuated, a unitary assembly comprising a toroidal shaped magnetic core, at least one drive wire threaded through said magnetic core, and a molded plastic support element for supporting said magnetic core and said drive and sense wires, said drive wires and said sense wires being configured such that said drive and sense wires may be connected to a printed circuit board, said magnetic core being magnetically saturated when said permanent magnets are in one of their positions and said magnetic core being magnetically unsaturated when said permanent magnets are in the other of their positions and said support element comprising at least one integrally formed brace member for supporting said magnetic core constructed to be flexible so as to relieve pressure on said core which would otherwise result from said molding of said support element.

2. A keyboard switch as claimed in claim 1 wherein said support element comprises a pair of brace members located on diametrically opposite sides of said magnetic core.

* * * * *